United States Patent
Cheng et al.

(10) Patent No.: US 6,991,991 B2
(45) Date of Patent: Jan. 31, 2006

(54) METHOD FOR PREVENTING TO FORM A SPACER UNDERCUT IN SEG PRE-CLEAN PROCESS

(75) Inventors: Ya-Lun Cheng, Taipei (TW); Chin-Cheng Chien, Hsin-Chu (TW); Neng-Hui Yang, Hsin-Chu (TW); Yu-Kun Chen, Hsin-Chu (TW)

(73) Assignee: United Microelectronics Corp., Hsin Chu (TW)

( * ) Notice: Subject to any disclaimer, the term of this patent is extended or adjusted under 35 U.S.C. 154(b) by 0 days.

(21) Appl. No.: 10/705,500

(22) Filed: Nov. 12, 2003

(65) Prior Publication Data

US 2005/0101093 A1 May 12, 2005

(51) Int. Cl.
*H01L 21/336* (2006.01)
*H01L 21/302* (2006.01)

(52) U.S. Cl. .................. 438/303; 438/595; 438/749
(58) Field of Classification Search .............. 438/300, 438/303, 595, 749, 756, 757
See application file for complete search history.

(56) References Cited

U.S. PATENT DOCUMENTS

| | | | | |
|---|---|---|---|---|
| 4,269,654 A | * | 5/1981 | Deckert et al. ............. | 438/756 |
| 4,820,654 A | * | 4/1989 | Lee ............................. | 438/429 |
| 6,087,235 A | * | 7/2000 | Yu .............................. | 438/300 |
| 6,174,787 B1 | * | 1/2001 | Fuller et al. ................. | 438/440 |
| 6,190,977 B1 | * | 2/2001 | Wu .............................. | 438/300 |
| 6,261,911 B1 | * | 7/2001 | Lee et al. .................... | 438/300 |
| 6,326,281 B1 | * | 12/2001 | Violette et al. ............. | 438/413 |
| 6,355,533 B2 | * | 3/2002 | Lee ............................. | 438/366 |
| 6,475,893 B2 | * | 11/2002 | Giewont et al. ............ | 438/586 |
| 6,545,317 B2 | * | 4/2003 | Hokazono et al. .......... | 257/336 |
| 6,635,938 B1 | * | 10/2003 | Nakahata et al. ........... | 257/382 |
| 6,683,356 B2 | * | 1/2004 | Tsuchiaki ................... | 257/412 |
| 2001/0045612 A1 | * | 11/2001 | Inard et al. ................. | 257/506 |

* cited by examiner

*Primary Examiner*—Matthew Smith
*Assistant Examiner*—Lex H. Malsawma
(74) *Attorney, Agent, or Firm*—Nath & Associates PLLC; Harold L. Novick

(57) ABSTRACT

A method for preventing to form a spacer undercut in SEG preclean process is provided. This present invention utilizes HFEG solution to etch the first spacer and the second spacer simultaneously, which can prevent from producing a spacer undercut, meanwhile; a native oxide layer upon a surface of a semiconductor substrate is removed. Hence, the clean surface on the semiconductor substrate is obtained. This method includes the steps as follows: Firstly, the native oxide layer upon the surface of the semiconductor substrate is removed by DHF (HF in deionized water) solution. Then, etching the first spacer and the second spacer at the same time by HFEG (HF diluted by ethylene glycol) solution. Also, the native oxide upon the semiconductor substrate is removed. Therefore, it obtains the clean semiconductor surface without a serious spacer undercut.

13 Claims, 4 Drawing Sheets

METHOD FOR PREVENTING TO FORM A SPACER UNDERCUT IN SEG PRE-CLEAN PROCESS

BACKGROUND OF THE INVENTION

1. Field of the Invention

The present invention relates to a method of preventing to form a spacer undercut, and more particularly to a method of etching the oxide and nitride spacer simultaneously to prevent from forming a spacer undercut in SEG Pre-clean process.

2. Description of the Prior Art

Generally, as semiconductor dimensions continue to shrink and device densities increase, contact resistance and junction depth become increasingly critical for device performance. Raised source and drain structures can provide shallow junctions with low series resistance, enhancing performance. Raised source and drain structures are typically fabricated using selective epitaxial growth (SEG) method which need a clean surface of silicon substrate; however, the surface of silicon substrate is accessible to form a native oxide with aqueous and oxygen atom from the air, for instance a silicon dioxide layer. Therefore, it is generally utilized hydrofluoric acid (HF) solution to remove the native oxide on the silicon substrate. However, employing hydrofluoric acid in order to remove the oxide on the silicon substrate that will produce a spacer undercut and result in leakage current between source, drain and gate.

The formation of an undercut is due to the wet etching. A thin film will be generated two kinds of profile after etching process, which is isotropic and anisotropic etching profile respectively. Also, the wet etching is belonged to isotropic etching and chemical reaction that does not have any direction when performing a reaction. It will produce lateral and vertical etching simultaneously; therefore, the undercut is created.

Typically, the Pre-clean process before performing SEG in raised source and drain modules is described as in FIG. 1A and FIG. 1B. Referring to FIG. 1A, a semiconductor substrate 101 is provided firstly; for instance a p-type or n-type silicon substrate. Then, a plurality of isolation is formed in the semiconductor substrate 101; for instance a plurality of isolation is formed by shallow trench isolation (STI) process. A gate oxide 105 and a gate electrode 107 are sequentially formed between the plurality of isolation. Next, a spacer 109 of the double-film structure is formed on the side-wall gate oxide 105 and side-wall gate electrode 107; wherein the spacer 109 comprises a silicon dioxide layer 109A and a silicon nitride layer 109B. Referring to FIG. 1B, an epi-layer is formed subsequently as raised source and drain 113 on the exposed semiconductor substrate 101 by selective epitaxial growth (SEG) and chemical vapor deposition (CVD) method. However, it need the clean surface of the semiconductor substrate 101 prior to forming the epi-layer by SEG technique so that a way of wet etching, which utilizes DHF (HF in deionized water), will remove the native oxide on the semiconductor substrate 101. As a result, the hydrofluoric acid; wherein the HF is diluted in deionized water ($1/100$ in volume %) silicon dioxide layer 109A of the spacer 109. Therefore, an undercut 111 will be created within the silicon dioxide spacer. Also, after raised source/drain 113 is deposited by SEG technique, the undercut 111 will generate defects between raised source/drain 113 and gate 107, further; leakage current will be produced. In addition, the epi-layer will be selectively grown under the spacer 109 and toward to gate electrode 107; therefore, it will result in bridge effect after forming salicide between raised source/drain 113 and gate 107.

Due to the fact that utilizes a hydrofluoric acid solution in order to remove the native oxide, a spacer undercut is created and result in leakage current between source, drain and gate. Therefore, the present invention provides a method for preventing to form a spacer undercut in SEG Pre-clean process.

SUMMARY OF THE INVENTION

In accordance with the present invention, a method for providing an improved etching process which utilizes a HFEG (HF diluted by ethylene glycol) solution to etch oxide and nitride simultaneously. Compare to oxide, nitride is etched comparatively faster than oxide is. It is an objective of the present invention to provide a method for improvement in formation of an undercut in Pre-clean process that utilizes a hydrofluoric acid solution to remove the native oxide on the semiconductor substrate in the prior art. It is another objective of the present invention is that provides a method for obtaining a clean surface of the semiconductor in order to form raised source and drain structure with SEG technique. It is yet another objective of the present invention is that provides a method for preventing leakage current is formed between raised source/drain and gate because of formation of the spacer undercut in Pre-clean process.

According to a preferred embodiment of the present invention, a semiconductor substrate is provided firstly which comprises a plurality of isolation, and then a gate structure is formed on the semiconductor substrate that comprises a gate oxide and a polysilicon gate electrode thereof. Following, a first spacer is formed on the side-wall polysilicon gate electrode and side-wall gate oxide; for instance a silicon dioxide spacer. Then, a second spacer is formed on the side-wall first spacer; for instance a silicon nitride spacer. As a result, there is a native oxide on the semiconductor substrate, and it is necessary to clean the surface of the semiconductor with DHF before forming the raised source and drain with SEG. While using DHF to clean the surface of the semiconductor, the first spacer is etched partially so that a spacer undercut is created. Subsequently, the second spacer and the first spacer are removed partially by a HFEG solution in order to obtain a negligible undercut within the first spacer, meanwhile; the native oxide on the semiconductor surface is removed. Hence, a clean surface of the semiconductor substrate is obtained. Finally, raised source and drain structure is formed on the surface of the semiconductor substrate with SEG technique.

BRIEF DESCRIPTION OF THE DRAWINGS

The objectives and features of the present inventions as well as advantages thereof will become apparent from the following detailed description, considered in conjunction with the accompanying drawings. It is to be understood, however, that the drawings, which are not to scale, are designed for the purpose of illustration and not as a definition of the limits of the invention, for which reference should be made to the appended claims.

The present invention can be the best understood through the following description and accompanying drawings, wherein.

DESCRIPTION OF THE PREFERRED EMBODIMENT

Figure 1A:
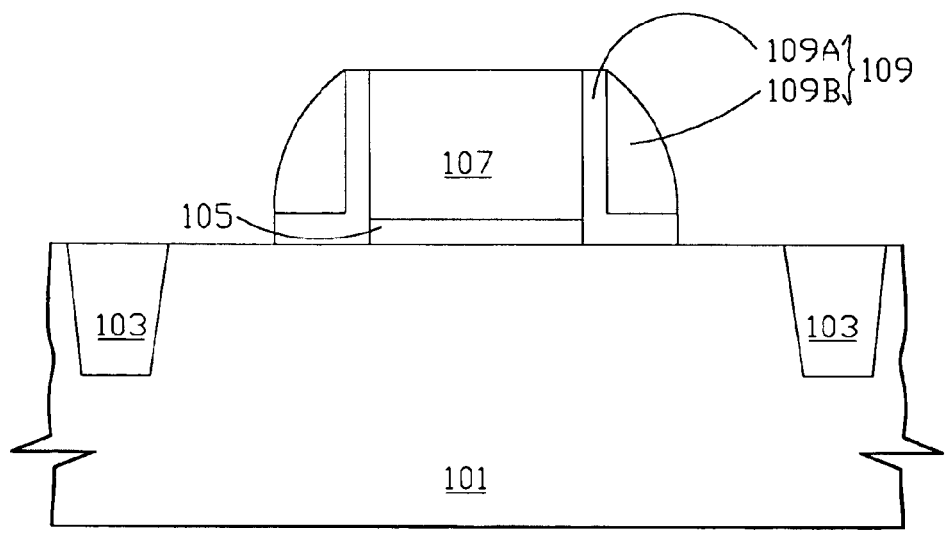
FIG. 1A to 1B shows schematically cross-sectional views of various steps of a conventional method for Pre-clean process.
Figure 1B:
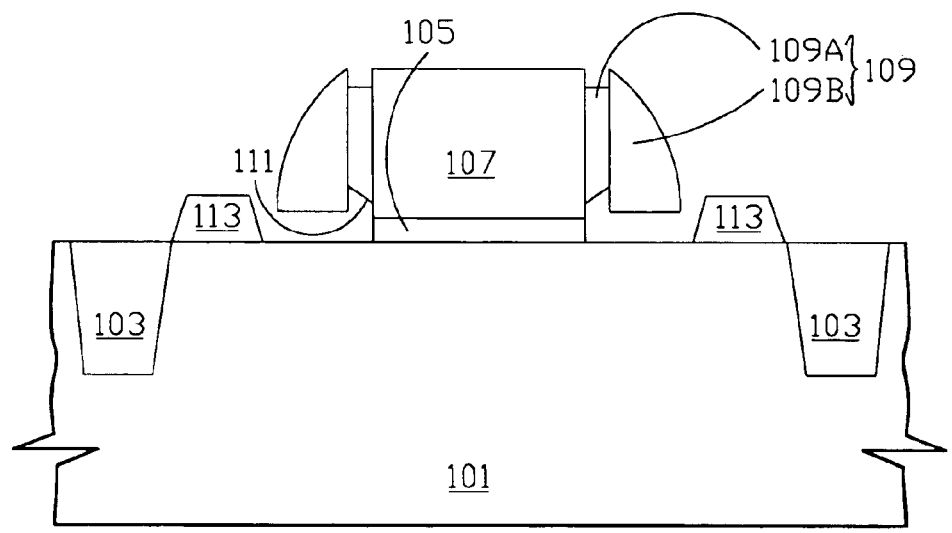
Figure 2A:
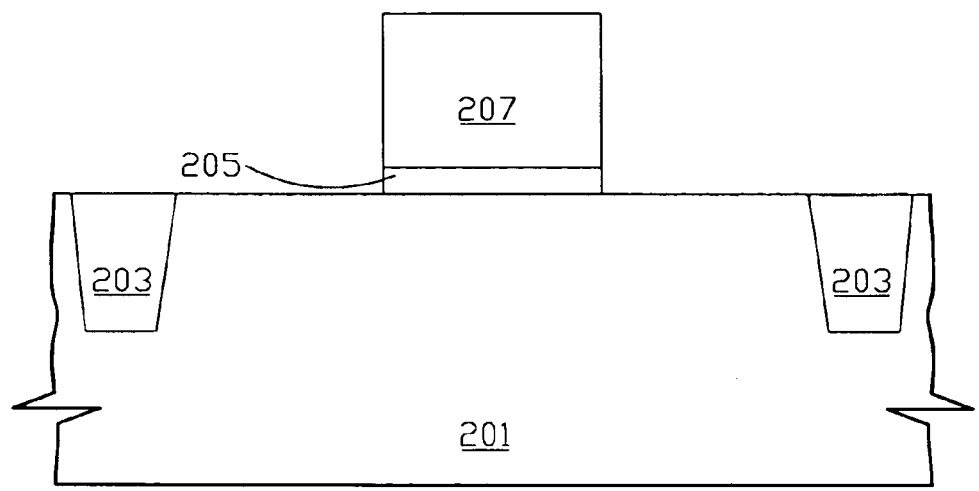
FIGS. 2A to 2E shows schematically cross-sectional views of various steps of the present method for preventing a spacer undercut is formed in Pre-clean process according to one embodiment of the present invention.

Preferred embodiment of this invention will be explained with reference to the drawings of FIGS. 2A to 2E. Referring to FIG. 2A, a semiconductor substrate 201 is provided firstly; for instance silicon dioxide. An oxide layer (not illustrated) is deposited on the semiconductor substrate 201; for instance silicon dioxide. A dielectric layer (not illustrated) is deposited on the oxide layer; for instance silicon nitride. The oxide and nitride layers are defined as a mask layer of an active region in the semiconductor substrate 201. Thereafter, etching a portion of the mask layers through a dry etching process, and dry etching is performed and stopped within the semiconductor substrate 201 so as to form a plurality of shallow trench. Then, the surfaces of shallow trench have an oxidation so that the damage on the shallow trench surface will be filled and repaired. Subsequently, performing trench filling with silicon dioxide by chemical vapor deposition (CVD) technique and planarizing the trench oxide layer by chemical mechanical polishing (CVD) technique so that a plurality of isolation 203 is formed, which can provide a isolation between each semiconductor device through subsequent processes. Following, a gate structure, which comprises a thin gate oxide 205 and a polysilicon gate electrode 207 thereof, is formed sequentially on the semiconductor substrate 201 and between a pair of isolation 203, wherein the polysilicon gate electrode 207 is formed upon the gate oxide 205.

Figure 2B:
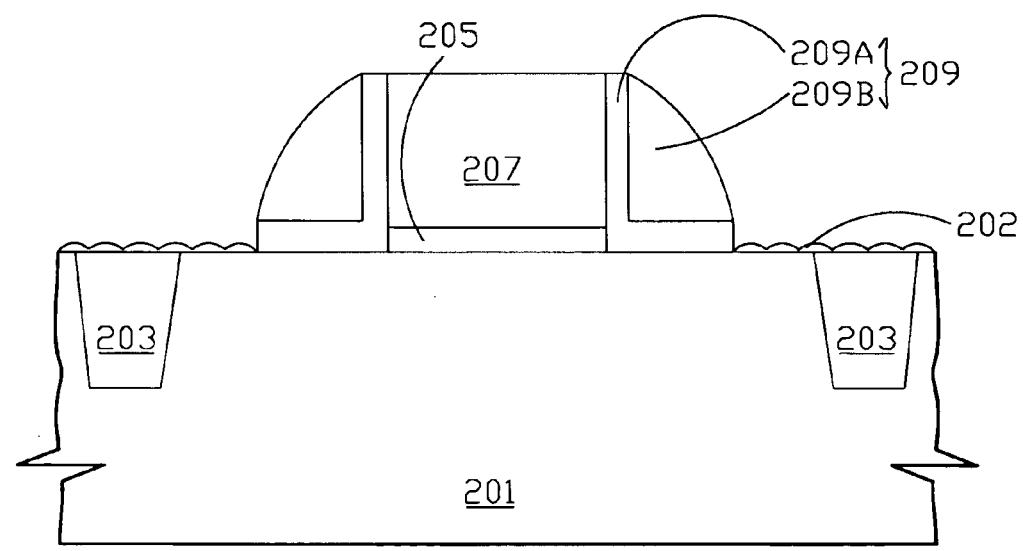

Subsequently, referring to FIG. 2B, a pair of spacer of double-film structure 209 is formed on the side-wall of the gate structure, which comprises the polysilicon gate electrode 207 and the gate oxide 205. The spacer 209 comprises a first spacer 209A and a second spacer 209B, wherein the first spacer 209A is formed firstly on the side-wall polysilicon gate electrode 207 and the side-wall gate oxide 205, and then the second spacer 209B is formed on the side-wall first spacer 209A. More, the first spacer 209A comprises a silicon dioxide layer, and the second spacer 209B comprises a silicon nitride layer. The spacer 209 is formed by way of the following steps: At first, a conformal silicon dioxide layer 209A is formed on the semiconductor substrate 201 surface and polysilicon gate electrode 207, then, forming a silicon nitride 209B on the conformal silicon dioxide layer 209A. After that, anisotropic etching this conformal silicon dioxide layer 209A and silicon nitride layer 209B with a way of dry etching; for instance reaction ion etch (RIE) method, so the spacer 209 of double-film structure is formed. The conformal silicon dioxide layer 209A is deposited with a way of CVD; for instance Plasma Enhanced CVD (PECVD); in addition, the silicon nitride layer 209B is deposited with a way of CVD; for instance Low Pressure CVD (LPCVD) or tetraethylorthosilicate CVD (TEOS-CVD). As a result, a native oxide 202 is accessible to form by oxide and aqueous atom from the air; for instance silicon dioxide. Also, raised source and drain is formed by SEG technique; however, the epitaxial is only selectively growth on the silicon substrate surface with SEG technique, whereas oxide and nitride will not. Therefore, it is necessary to have a clean surface of semiconductor substrate 201 that performs a Pre-clean process to remove the native oxide 202 prior to forming raised source and drain.

Figure 2C:
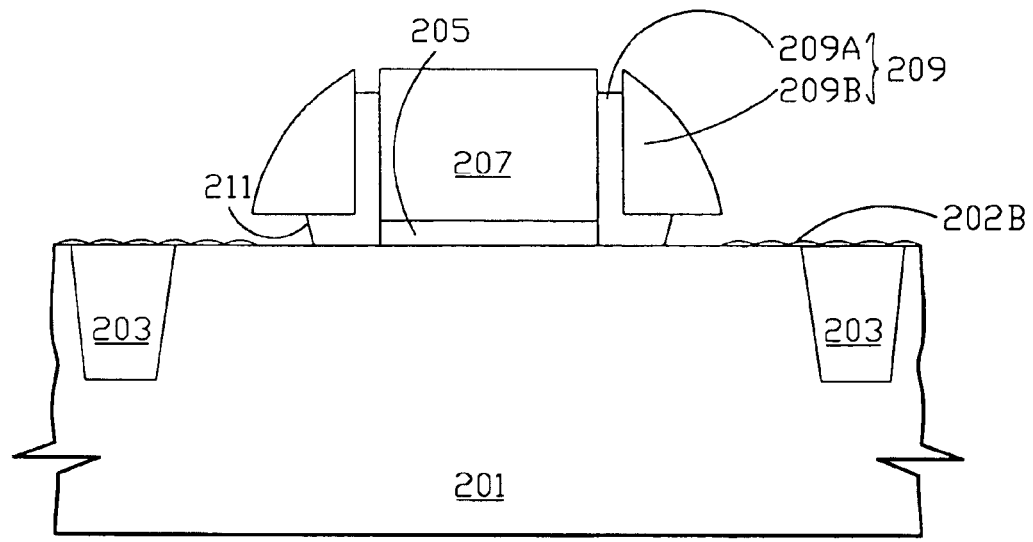

Referring to FIG. 2C, utilizing a hydrofluoric acid solution to remove a portion of native oxide 202 so that a remaining native oxide 202B is formed on the semiconductor substrate 201. The hydrofluoric acid is diluted in deionized water (DHF), wherein the volume ratio for deionized water to hydrofluoric acid is about 10:1–100:1, the preferred ratio is about 100:1. When removing the native oxide 202 by HF, it will produce an undercut with a sunken profile due to the fact that the wet etching is belonged to isotropic etching. Therefore, the first spacer 209A of silicon dioxide layer and the native oxide 202 will be partially etched, more, when horizontal etching is performed to etch first spacer 209A, a film is under the first spacer 209A will also be etched. Hence, it will produce a spacer undercut with a sunken profile within the first spacer 209A of silicon dioxide layer. The problem with a spacer undercut will generate defects between source/drain and gate after forming raised source and drain by SEG technique, further, result in leakage current thereof. Also, epitaxial is selectively growth under the spacer 207, even toward to the polysilicon gate electrode 207. Hence, it will produce bridge effect between raised source/drain and polysilicon gate electrode 207 after forming salicide.

Figure 2D:
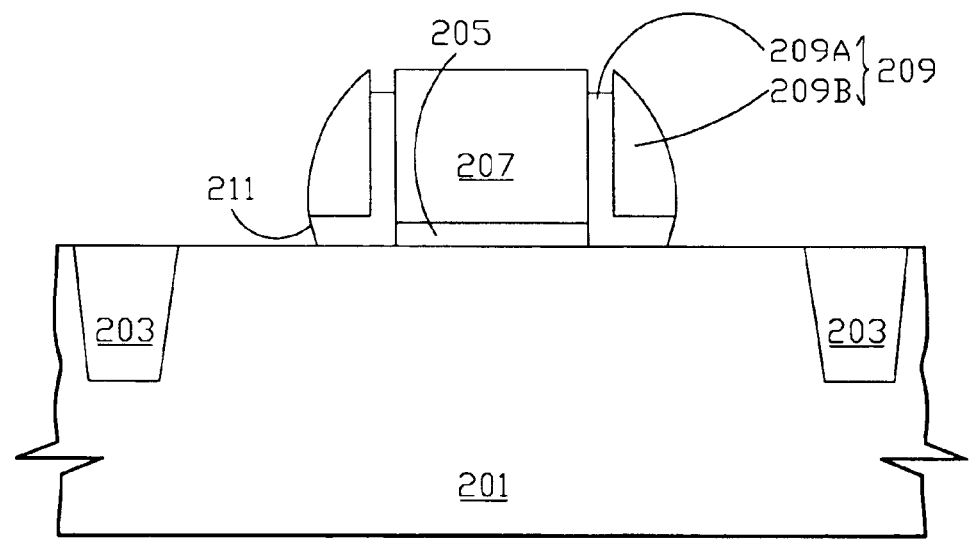

Accordingly, in order to solve a spacer undercut, which is an oxide film of the first spacer, is created in Pre-clean process because using hydrofluoric acid to remove a native oxide on the surface of the semiconductor substrate 201 before performing SEG technique. The present invention provides a method for improving the Pre-clean process, wherein HFEG (HF diluted by ethylene glycol) is utilized to etch the first spacer 209A of silicon dioxide and the second spacer 209B of silicon nitride simultaneously. Therefore, the undercut 211 within the first spacer 209A is removed or neglected. The HFEG solution in which the hydrofluoric acid is diluted in glycol(0–4% in volume %), and the etching selectivity is about 2:1 for nitride to oxide; for this reason, the etching rate of nitride is faster than oxide. Referring to FIG. 2D, etching the first spacer 209A and second spacer 209B simultaneously by HFEG. Also, the most of the second spacer 209B and a portion of the first spacer 209A are removed because the etching rate of the second spacer 209B is faster than first spacer 209A is. More, the formation of an undercut 211 is modified in the meanwhile using DHF to remove the native oxide 202, further, it can also clean the remaining oxide layer 202B on the semiconductor substrate 201. By this way, it not only removes the native oxide 202 on the surface of semiconductor substrate 201 but also obtains a clean semiconductor substrate surface. Besides, it can reduce the problems that comprise the formation of an undercut 211 within the first spacer 209A and the leakage current are produced between source/drain and gate. Finally, the Pre-clean process is successively completed.

Figure 2E:
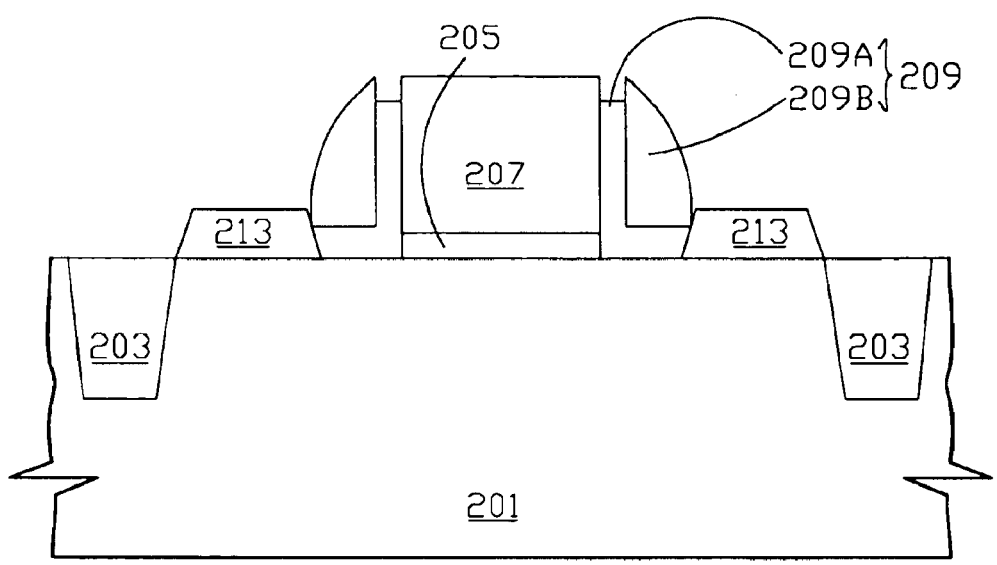

As soon as obtain a clean semiconductor substrate 201 surface, as shown in FIG. 2E. By a selective epitaxial growth and chemical vapor deposition technique; for instance ultra-high vacuum chemical vapor deposition (UHCVD), wherein an epitaxial layer is formed as raised source and drain 213 on the exposed semiconductor substrate 201 and between plurality of isolations 203 and spacer 209. As the above-mention, the low pressure CVD method comprises dichlorosiliane ($SiH_2Cl_2$) as a reaction gas and the UHCVD method therein comprises disilane ($SiH_4$) as a reaction gas. Then, implanting dopant into raised source/drain 213 by ion implantation.

In accordance with the present invention, one of the advantages is that provides a Pre-clean process, which comprises a suitable etching solution in etching rate and etching selectivity, this is, etching the first spacer and second spacer at the same time. Hence, it can modify the first spacer undercut because of etching process by DHF to remove the native oxide on the semiconductor substrate surface. In addition, it also can prevent from producing leakage current between source/drain and gate, which is sequentially formed by a SEG method.

The preferred embodiments are only used to illustrate the present invention, not intended to limit the scope thereof. Many modifications of the preferred embodiments can be made without departing from the spirit of the present invention.

What is claimed is:

1. A method for preventing to form a spacer undercut in SEG Pre-clean process, comprising:
   providing a semiconductor substrate;
   forming a gate structure on said semiconductor substrate;
   forming a spacer of double-film structure on a side-wall of said gate structure, wherein said spacer of double-film structure comprises a first spacer and a second spacer, said first spacer being formed between said side-wall of said gate structure and said second spacer;
   removing a portion of a surface of said semiconductor substrate by using a DHF (hydrofluoric acid diluted in deionized water) solution to remove a native oxide layer on said surface of said semiconductor substrate; and
   etching said first spacer and said second spacer, wherein an etching rate of said second spacer is faster than an etching rate of said first spacer.

2. The method for preventing to form a spacer undercut in SEG Pre-clean process according to claim 1, wherein a volume ratio for hydrofluoric acid to deionized water is about 1:10–1:100 in said DHF solution.

3. The method for preventing to form a spacer undercut in SEG Pre-clean process according to claim 1 wherein etching said first spacer and said second spacer comprises a HFEG (HF diluted by ethylene glycol) solution is utilized.

4. The method for preventing to form a spacer undercut in SEG Pre-clean process according to claim 3, wherein a volume ratio for hydrofluoric acid to ethylene glycol is 0–4% in said HFEG solution.

5. The method for preventing to form a spacer undercut in SEG Pre-clean process according to claim 1, wherein said first spacer comprises silicon dioxide.

6. The method for preventing to form a spacer undercut in SEG Pre-clean process according to claim 5, wherein said second spacer comprises silicon nitride.

7. The method for preventing to form a spacer undercut in SEG Pre-clean process according to claim 1, wherein formation of said raised source/drain is formed by selective epitaxial growth (SEG) method.

8. A method for preventing to form a spacer undercut in SEG Pre-clean process, comprising:
   providing a semiconductor substrate;
   forming a gate structure on said semiconductor substrate, wherein said gate structure comprises a gate oxide and a polysilicon gate electrode, said polysilicon gate electrode on said gate oxide;
   forming a first spacer comprising silicon dioxide on a side-wall of said polysilicon gate electrode and said gate oxide;
   forming a second spacer comprising silicon nitride on a side-wall of said first spacer;
   performing a first Pre-clean process, using a DHF solution to clean a surface of said semiconductor substrate;
   performing a second Pre-clean process, using a HFEG solution to clean a portion of said surface of said semiconductor substrate and a portion of said first spacer and a portion of said second spacer; and
   forming a raised source/drain on said surface of said semiconductor substrate.

9. The method for preventing to form a spacer undercut in SEG Pre-clean process according to claim 8, wherein a volume ratio for hydrofluoric acid to deionized water is about 1:10–1:100 in said DHF solution.

10. The method for preventing to form a spacer undercut in SEG Pre-clean process according to claim 8, wherein said raised source/drain is formed by selective epitaxial growth (SEG) method.

11. The method for preventing to form a spacer undercut in SEG Pre-clean process according to claim 10, wherein said selective epitaxial growth (SEG) method for said raised source/drain is selected from a group consisting of low pressure chemical vapor deposition and ultra-high vacuum chemical vapor deposition.

12. The method for preventing to form a spacer undert in SEG Pre-clean process according to claim 10, wherein said raised source/drain comprises epitaxial silicon.

13. The method for preventing to form a spacer undercut in SEG Pre-clean process according to claim 8, wherein a volume ratio for hydrofluoric acid to deionized water is about 1:10–1:100 in said DHF solution. comprises epitaxial silicon.

* * * * *